United States Patent [19]

Ward

[11] Patent Number: 4,608,332
[45] Date of Patent: Aug. 26, 1986

[54] ELECTRON LITHOGRAPHY MASK MANUFACTURE

[75] Inventor: Rodney Ward, Crawley, England

[73] Assignee: U.S. Philips Corporation, New York, N.Y.

[21] Appl. No.: 606,089

[22] Filed: May 1, 1984

[30] Foreign Application Priority Data

May 25, 1983 [GB] United Kingdom ............... 8314435

[51] Int. Cl.⁴ ............................................. G03C 5/00
[52] U.S. Cl. ........................................ 430/296; 430/5; 430/942; 250/492.2; 427/43.1
[58] Field of Search ............................ 430/5, 296, 942; 250/492.2; 427/43.1; 219/121 LJ

[56] References Cited

U.S. PATENT DOCUMENTS 3,686,028 8/1972 O'Keeffe ............................... 427/75
3,983,401 9/1976 Livesay ............................. 250/492.2
4,088,896 5/1978 Elkins et al. ........................ 250/505

Primary Examiner—John E. Kittle
Assistant Examiner—José G. Dees
Attorney, Agent, or Firm—Paul R. Miller

[57] ABSTRACT

A layer of electron sensitive resist on a semiconductor substrate is exposed to a patterned electron beam emitted from an erasable photocathode mask in an electron image projector. The mask is formed from a transparent plate, such as quartz, on which a layer of caesium iodide or other photoemissive material is provided. A photoemissive pattern is defined in this layer by selective direct exposure to a beam of photons, electrons, or ions, preferably in an evacuated environment containing carbon whereby the photoemission of the exposed areas of the layer is lowered. Alternatively, using a beam of charged particles with a relatively high current density, the exposed parts of the layer are actually removed by evaporation. In either case, the patterned layer can be removed by rinsing in water and the transparent plate can be reused with the same or different photoemissive pattern.

10 Claims, 2 Drawing Figures

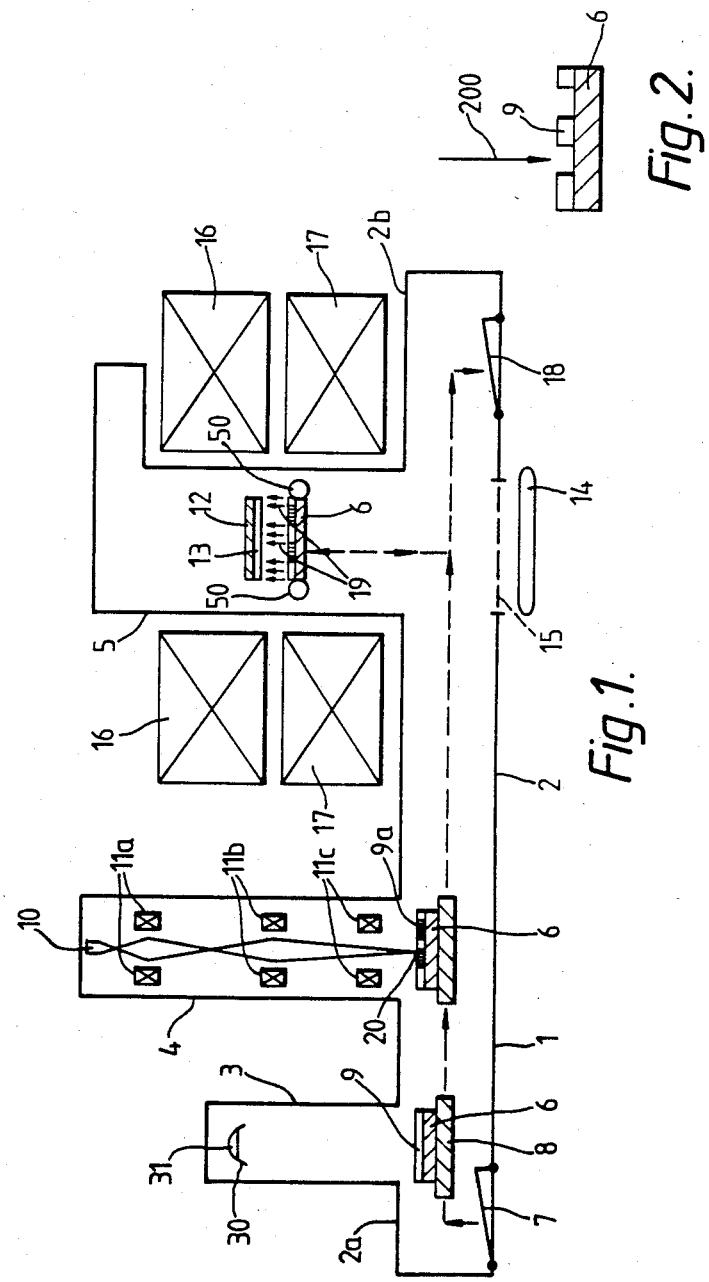

ELECTRON LITHOGRAPHY MASK MANUFACTURE

This invention relates to a method of lithographically defining a pattern in a layer of electron sensitive resist on a substrate and further relates to an apparatus for use in such a method.

In the manufacture of high resolution microminiature solid state devices, particularly semiconductor devices, a layer of electron sensitive resist present on a substrate can be exposed to a patterned electron beam projected from a photocathode mask using a lithographic tool known as an electron image projector. The principle of the electron image projector is itself well-known and for further information reference is invited, for example, to the paper by J. P. Scott entitled "1:1 Electron Image Projector" which appeared in Solid State Technology, May 1977, pages 43 to 47. The main advantages of electron image projection can be summarised as fast exposure times and high resolution capability.

Conventionally the mask for the electron image projector is made by providing a layer of opaque material, e.g. a layer of chromium 1,000 angstroms thick, on the front side of a transparent quartz plate. The opaque layer is patterned using lithographic and etching techniques and then a continuous photoemissive layer, for example a layer of caesium iodide 2,000 angstroms thick, is provided to cover the patterned opaque layer and the exposed areas of the plate. Thus, when the reverse side of the mask is illuminated with electromagnetic radiation, electrons are emitted from the photoemissive layer but only from those areas where the patterned opaque layer is not present.

While the conventional method of manufacturing a photocathode mask produces results which are quite satisfactory it does unfortunately involve numerous processing steps as follows: (1) the opaque layer is deposited on the transparent plate, (2) a layer of radiation sensitive resist is provided on the opaque layer, (3) the resist is selectively exposed, (4) the resist is developed, (5) the exposed parts of the opaque layer are removed by etching, (6) the remaining resist is cleaned from the patterned opaque layer, and finally (7) the photoemissive layer is provided.

Also, it is noted here that the mask made in this manner is permanent in the sense that it can be used only with the patterned opaque layer originally defined.

According to a first aspect of the present invention there is provided a method of lithographically defining a pattern in a layer of electron sensitive resist on a substrate, in which an electron emissive mask comprising a photoemissive pattern on a transparent plate is illuminated with electromagnetic radiation to cause a patterned beam of electrons to be emitted from the photoemissive pattern, and the layer of electron sensitive resist on the substrate is exposed to the patterned electron beam, characterised in that the photoemissive pattern of the mask is defined by selectively exposing a layer of photoemissive material on the transparent plate to radiation which effects a local modification in the electron emissive properties of the mask.

In this method the photoemissive pattern is defined by direct exposure of the photoemissive layer which has the advantage that the overall number of stages involved in making the mask is reduced. In particular, the steps which are avoided are: (1) providing an opaque layer, (2) providing a resist layer, (3) developing the resist, (4) etching the opaque layer and (5) cleaning off the remaining resist.

Also, by avoiding the developing and etching stages there is the further advantage that the photoemissive pattern can be defined more accurately because it is particularly at these stages in the conventional method where feature size variations can easily be introduced, the resolution degraded, and the defect count increased.

Moreover, the mask of the present method has the advantage of being erasable, i.e. it is not permanent, because the photoemissive pattern can readily be cleaned off the transparent plate and a new pattern defined in a fresh photoemissive layer on the same plate.

The radiation to which the photoemissive layer is exposed may be a beam of photons or charged particles. In the case of charged particles, a relatively high dose may be used to remove locally parts of the photoemissive layer, the remaining parts forming the photoemissive pattern of the mask. Alternatively, with a lower dose, a charged particle beam may be used to modify locally the photoemission of the photoemissive layer. In this case, the photoemissive layer remains intact and the unexposed parts again form the photoemissive pattern. In both cases, the photoemissive layer is exposed to the beam of charged particles in an evacuated environment and, in the latter case, the Applicants have found that it is preferable if the environment contains residues comprising carbon. It is believed that the carbon is instrumental in locally raising the work function of the exposed parts of the photoemissive layer so that when the mask is illuminated with electromagnetic radiation of an appropriate wavelength the electrons are emitted only from unexposed parts of the photoemissive layer.

According to a further aspect of the present invention there is provided apparatus for use in a method of lithographically defining a pattern in a layer of electron sensitive resist in accordance with the first aspect of the invention, characterised in that the apparatus includes a unitary vacuum envelope comprising first and second chambers and an interconnecting barrel extending therebetween, wherein the first chamber contains means for selectively exposing to radiation a layer of photoemissive material on the transparent plate to form the photoemissive pattern on the mask, and the second chamber contains means for projecting a patterned beam of electrons from the mask to the layer of electron sensitive resist on the substrate.

This has the advantage that after defining the photoemissive pattern the transparent plate can readily be maintained in a relatively contaminant-free, dry atmosphere which reduces the risk of introducing defects in the mask. This risk is further reduced if the unitary vacuum envelope further comprises a third chamber containing means for providing the layer of photoemissive material on the transparent plate, the interconnecting barrel also extending between the first and third chambers.

Embodiments of the invention will now be described, by way of example, with reference to the accompanying drawing, in which:

FIG. 1 is a diagrammatic cross-sectional view of apparatus for a method in accordance with the invention, and FIG. 2 is a diagrammatic cross-sectional view showing a modified mask formation stage of another method in accordance with the invention.

The electron lithography apparatus shown in FIG. 1 is for use in the manufacture of semiconductor devices and comprises a unitary vacuum envelope 1 made of, for example, aluminium and stainless steel. The vacuum envelope 1 comprises three upwardly extending chambers 3,4,5 and an interconnecting barrel 2 which extends therebetween and which has extensions 2a, 2b extending beyond the chambers 3 and 5 respectively. The chamber 3 on the left hand side in FIG. 1 is an evaporation chamber, the chamber 4 in the middle is an electron beam column chamber and the chamber 5 on the right hand side is an electron beam image projector chamber 5.

As described in more detail below, it is in the image projector chamber 5 that an electron sensitive resist layer 13 present on a semiconductor substrate 12 can be exposed to a patterned electron beam projected from a photocathode mask 6,9. The photocathode mask itself is made in the evaporation and electron beam chambers 3 and 4 as follows.

A circular quartz plate 6 which is 115 mm in diameter and 3 mm thick is introduced into the vacuum envelope 1 through a sealable port-entry represented in FIG. 1 as a hinged flap 7. The transparent plate 6 is positioned on a movable carriage 8 initially located in the barrel extension 2a. The vacuum envelope 1 is evacuated to a pressure of, for example, $10^{-5}$ Torr using a conventional oil pump. The plate 6 is then transported on the carriage 8 horizontally along the barrel extension 2a to the area of the evaporation chamber 3 where a photoemissive layer 9 of, for example, caesium iodide 200 angstroms thick is evaporated in known manner onto the upwardly directed surface of the quartz plate 6 by heating caesium iodide powder 31 contained in a molybdenum boat 30. The plate 6 coated with caesium iodide layer 9 is then transported along the barrel 2 to the area of the electron beam column chamber 4 which contains an electron beam column in the form of a so-called electron beam pattern generator which in its own right is well-known to those skilled in the art. For further information about electron beam pattern generators reference is invited, for example, to the paper entitled "Imaging and Deflection Concepts in Electron Beam Lithography" by H. C. Pfeiffer in the Proceedings of the International Conference on Microlithography, Paris, June 1977, pages 145 to 151.

Basically the pattern generator comprises an electron gun source 10 and three demagnifying lenses 11a, 11b, 11c for focusing the electrons into a beam 20 onto a target plane. At the target the focussed beam spot may be circular with a gaussian distribution or it may be rectangular with fixed or variable size and shape depending, as is well known, on the precise structure of the electron optical column. The electron beam 20 is made to scan the caesium iodide layer 9 on the transparent plate 6 switching on and off under computer control so as to selectively expose the caesium iodide layer. Using an electron beam which delivers a total dose of, for example, 500 $\mu C/cm^2$ and in a carbon-containing evacuated environment it is found that the photoemissivity of the exposed areas of the caesium iodide is substantially reduced as compared with the unexposed parts. In FIG. 1 the shaded parts 9a of the caesium iodide layer represent the parts which are exposed to the electron beam.

The carbon in the evacuated environment is believed to be instrumental in raising the work function of the exposed parts 9a of the caesium iodide layer 9 so that when the quartz plate 6 is illuminated with ultra-violet radiation electrons are emitted only from the unexposed parts of caesium iodide layer 9. Thus the selectively exposed caesium layer on the quartz plate can be used as a photocathode mask in an electron image projector as described in more detail hereinafter.

By virtue of the oil in the vacuum pump hydrocarbon residues find their way automatically into the vacuum chamber. Also, there will be some carbon and/or carbon-containing molecules present in the evacuated environment as natural constituents of the atmosphere. Generally it can be said that there should be at least sufficient carbon in the environment to form a mono-layer on the surface of the caesium iodide. In practice, this amount will be far exceeded. If desired, the carbon content can be enhanced by introducing into the envelope 1 a carbon-containing contaminant, but without significantly raising the overall pressure. Thus, for example, carbon dioxide may be introduced at a partial pressure of the order of $10^{-5}$ Torr.

It is noted here that instead of using the electron beam to modify locally the photoemission of the caesium iodide layer 9 it may instead be used actually to remove the exposed parts of the caesium iodide layer as shown in FIG. 2 In this Figure the arrow 200 represents the electron beam. In this case, the dose used may be approximately $1C/cm^2$. The exposed parts of the caesium iodide layer 9 are removed by evaporation leaving the unexposed parts as a photoemissive pattern on the transparent plate 6 which can similarly be used as a photocathode mask in an electron image projector as described below.

Thus, in both cases a photocathode mask is formed by selectively exposing the layer 9 of caesium iodide on the transparent plate 6 to a focussed beam of electrons. In both cases, too, the photoemissive pattern of the mask is constituted by the unexposed parts of the caesium iodide layer 9.

The photocathode mask 6,9 thus formed is then transported on the carriage 8 horizontally along the barrel 2 to the area of the electron image projector column 5. As mentioned earlier, the principle of electron image projection is well known and for more detailed information reference is invited to the above-mentioned paper by J. P. Scott. Briefly, it can be said that the image projector is a unity magnification tool for copying a pattern from a photocathode mask onto a layer of electron sensitive resist at the surface of a semiconductor substrate.

In the present method the photocathode mask 6,9 is moved, for example using a compressed air-operated gripper mechanism 50, from the carriage 8 in a vertical direction in the chamber 5 towards a semiconductor substrate 12 situated in a horizontal plane and having a layer 13 of electron sensitive resist on its downwardly-directed surface. The photocathode mask 6,9 is moved to within approximately 5 mm of the resist-coated substrate 12 and is arranged to be parallel thereto. The carriage 8 is temporarily moved out of the electron image projection chamber 5. The mask is then illuminated with ultra-violet radiation from a source 14 outside the vacuum envelope 1. The ultra-violet radiation enters the envelope 1 through a window 15 and floods the underside of the quartz plate 6 which is transparent to the ultra-violet radiation causing electrons to be emitted from the photoemissive pattern on the upper side of the plate 6. The semiconductor substrate is maintained at a positive potential with respect to the photocathode mask in known manner and under the influence of a magnetic field generated by the electromagnetic focussing coils 16,17 a patterned electron beam 19 corresponding to the photoemissive pattern of the mask is projected towards the semiconductor substrate 12 to expose the layer of electron sensitive resist present thereon. After sufficient time to expose the electron sensitive resist the semiconductor substrate 12 can be removed from the chamber 5 for further processing. The same photocathode mask can be used many times over to expose a similar pattern on other substrates coated with electron sensitive resist. After up to a thousand or more exposures using the same mask the photoemissive properties of the caesium iodide may have deteriorated to such an extent that a new photocathode mask is desirable. The photocathode mask 9,6 is then moved back onto the carriage 8 which transports it horizontally along the envelope 1 into the barrel extension 2b from where the mask can be removed through a sealable port-exit represented by the hinged flap 18 in FIG. 1. The caesium iodide 9 can then be cleaned from the quartz plate 6 simply by rinsing in water and the quartz plate can be reused for another photocathode mask which may have the same or a different photoemissive pattern defined thereon in the same manner as already described. A different photoemissive pattern can be defined by altering the computer program for controlling the electron beam pattern generator.

It is noted here that in order to avoid charging effects it is often desirable to include a thin conducting layer on the photocathode mask between the quartz plate and the photoemissive pattern. For example, a layer of chromium 200 angstroms thick may be deposited in known manner on the upwardly-directed surface of the plate 6 before introducing the plate 6 into the vacuum envelope 1. For the sake of clarity, this conducting chromium layer, which is so thin as to be optically transparent is not shown in the drawing.

It is noted here that the description given above is merely exemplary and many modifications are possible within the scope of the invention. Thus, although the lithography apparatus described above has the various chambers extending vertically from a horizontal barrel, the whole apparatus or its component parts may be oriented differently. For example the evaporation chamber and the electron beam column chamber may extend vertically from a horizontal interconnecting barrel as described above, while the electron image projector chamber may extend in a horizontal plane, transversely to the barrel.

Furthermore, although the lithography apparatus described above is a unitary system, the evaporation chamber, the electron beam pattern generator and the electron image projector may alternatively be arranged as separate units. In this case, because of the hygroscopic nature of caesium iodide, it will be necessary to protect the coated quartz plate in a dry atmosphere when it is being transported between the different chambers.

Also, the photoemissive pattern can be defined in the photoemissive layer otherwise than by using an electron beam pattern generator. For example, an electron image projector could be used in which a patterned beam of electrons from a master photocathode mask is projected onto the caesium iodide layer on the quartz plate to make a replica mask which can then be used to expose a layer of electron sensitive resist on a semiconductor substrate as described above. Moreoever, photon or ion beams may be used to modify locally the photoemissivity in a manner analagous to that already described for electrons, and ions having higher doses and energies may further be used to remove parts of the photoemissive layer again in a manner analagous to that already described for electrons.

I claim:

1. A method of lithographically defining a pattern in a layer of electron sensitive resist on a substrate comprising the steps of defining a photoemissive pattern by selectively exposing a layer of photoemissive material on a transparent plate to radiation, said radiation causing local modification in electron emissive properties of said photoemissive material, illuminating said photoemissive pattern on said transparent plate with electromagnetic radiation to form an electron emissive mask, said step of illuminating causing a patterned beam of electrons to be emitted from said photoemissive pattern, and exposing a layer of electron sensitive resist on a substrate to said patterned beam of electrons.

2. A method according to claim 1, wherein said photoemissive pattern is defined by selectively exposing said layer of photoemissive material to said radiation for effecting said local modification in photoemission of said layer of photoemissive material.

3. A method according to claim 2, wherein said layer of photoemissive material is exposed in an evacuated environment.

4. A method according to claim 3, wherein said evacuated environment contains residues of carbon.

5. A method according to claim 1, wherein said photoemissive pattern is defined by selectively exposing said layer of photoemissive material to said radiation for effecting local removal of parts of said layer of photoemissive material.

6. A method according to claim 5, wherein said layer of photoemissive material is exposed to an evacuated environment.

7. A method according to claim 6, wherein said evacuated environment contains residues of carbon.

8. A method according to claim 1 or claim 2 or claim 5, wherein said layer of photoemissive material is caesium iodide.

9. A method according to claim 1 or claim 2 or claim 5, wherein said radiation is a beam of charged particles.

10. A method according to claim 9, wherein said beam of charged particles is a beam of electrons.

* * * * *